(12) United States Patent
Srivastava et al.

(10) Patent No.: US 10,333,504 B2
(45) Date of Patent: Jun. 25, 2019

(54) LOW POWER CLAMP FOR ELECTRICAL OVERSTRESS PROTECTION

(71) Applicant: Intel Corporation, Santa Clara, CA (US)

(72) Inventors: Amit Kumar Srivastava, Penang (MY); Chee Seng Leong, Wilayah Persekutuan (MY)

(73) Assignee: INTEL CORPORATION, Santa Clara, CA (US)

( * ) Notice: Subject to any disclaimer, the term of this patent is extended or adjusted under 35 U.S.C. 154(b) by 412 days.

(21) Appl. No.: 15/025,231

(22) PCT Filed: Nov. 26, 2013

(86) PCT No.: PCT/US2013/072101
§ 371 (c)(1),
(2) Date: Mar. 25, 2016

(87) PCT Pub. No.: WO2015/080710
PCT Pub. Date: Jun. 4, 2015

(65) Prior Publication Data
US 2016/0233854 A1    Aug. 11, 2016

(51) Int. Cl.
*H03K 5/08*    (2006.01)

(52) U.S. Cl.
CPC ..................... *H03K 5/08* (2013.01)

(58) Field of Classification Search
CPC ............. H02H 3/00; H02H 9/04; H02H 9/041
USPC ........................................................ 361/78
See application file for complete search history.

(56) References Cited

U.S. PATENT DOCUMENTS

| | | | | |
|---|---|---|---|---|
| 2009/0307381 A1* | 12/2009 | Croyle | ................. | G06F 13/387 710/14 |
| 2011/0131356 A1* | 6/2011 | Devam | ................. | G06F 13/426 710/105 |

FOREIGN PATENT DOCUMENTS

| | | |
|---|---|---|
| EP | 1777821 | 7/2008 |
| WO | 2013066338 | 5/2013 |

OTHER PUBLICATIONS

International Search Report dated Aug. 14, 2014 for PCT/US2013/072101, filed Nov. 26, 2013, 2 pages.
Written Opinion of the International Searching Authority dated Aug. 14, 2014 for PCT/US2013/072101, filed Nov. 26, 2013, 4 pages.
Korean Application No. 10-2016-7010569, Office Action, dated Jul. 17, 2017, 5 pgs.
International Preliminary Report dated Jun. 9, 2016 for PCT/US2013/072101, filed Nov. 26, 2013, 2 pages.

* cited by examiner

*Primary Examiner* — Dharti H Patel
(74) *Attorney, Agent, or Firm* — Womble Bond Dickinson (US) LLP

(57) ABSTRACT

Described is an apparatus which comprises: a sensor to detect entrance of single-ended-zero (SE0) state on first and second data lines, and to detect exit of the SE0 state; and a clamp unit to clamp an overshoot or undershoot condition on the first or second data lines during the detected entrance and exit of the SE0 state.

22 Claims, 10 Drawing Sheets

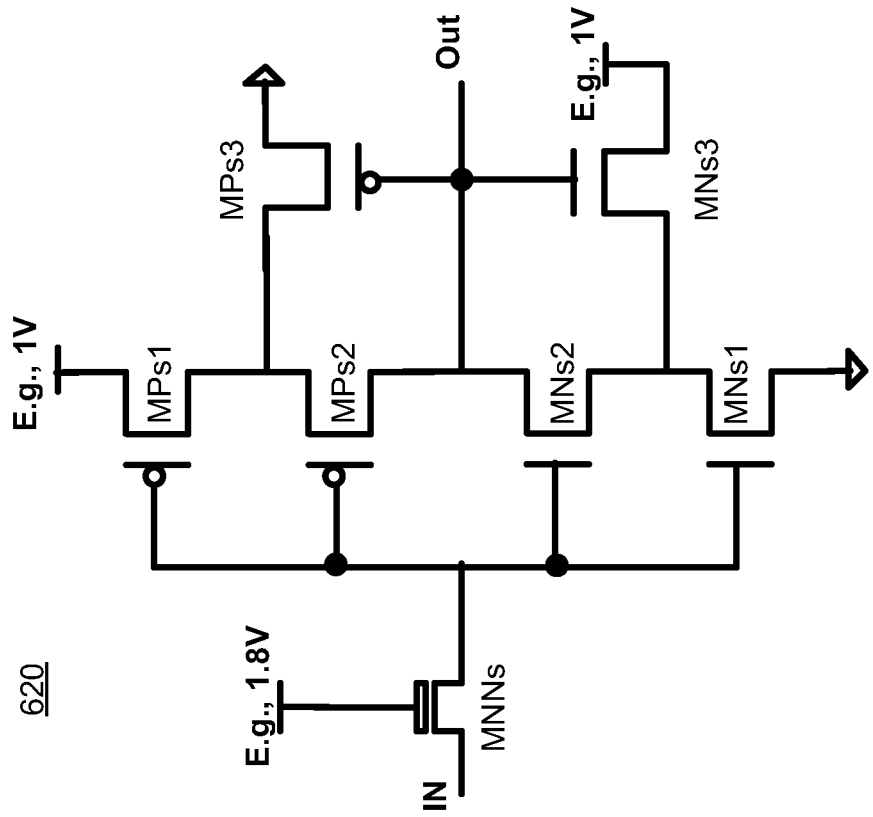
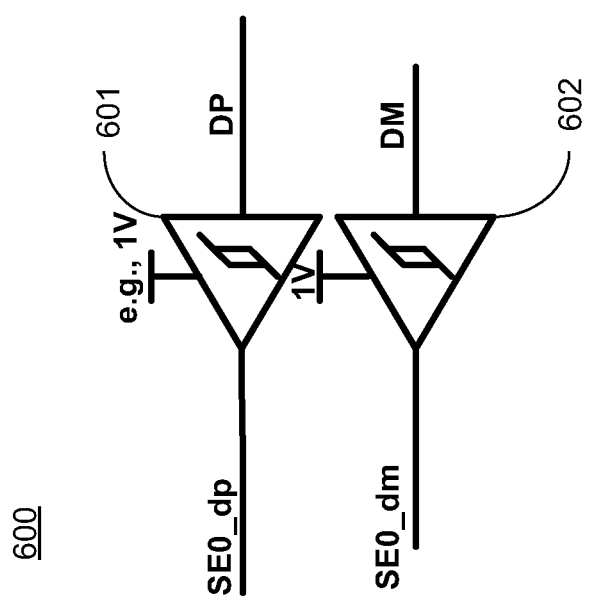
Fig. 6B
Fig. 6A

900

920

LOW POWER CLAMP FOR ELECTRICAL OVERSTRESS PROTECTION

RELATED APPLICATION

This patent application is a U.S. National Phase Application under 35 U.S.C. § 371 of International Application No. PCT/US2013/072101, filed Nov. 26, 2013, entitled LOW POWER CLAMP FOR ELECTRICAL OVERSTRESS PROTECTION.

BACKGROUND

Large overshoot (e.g. greater or equal to 4.2V) and undershoot (e.g., less than or equal to −0.6V) may be observed on interconnects when drivers coupled to interconnects enter or exit single-ended zero (SE0) state. For example, in Universal Serial Bus (USB) 2 compliant interconnect, when down stream USB2 device enters or exits SE0 state, large overshoot and undershoot may be generated. These overshoot and undershoot are generated due to mutual inductance coupling of common-mode voltages on the interconnect paths. Large overshoot and undershoot may cause reliability concern for the transistors connected to interconnect. Excess of reliability exposure may damage devices coupled to the interconnect.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 6A-B illustrates edge sensors to sense SE0 entrance detection, according to one embodiment of the disclosure.

DETAILED DESCRIPTION

Figure 1:
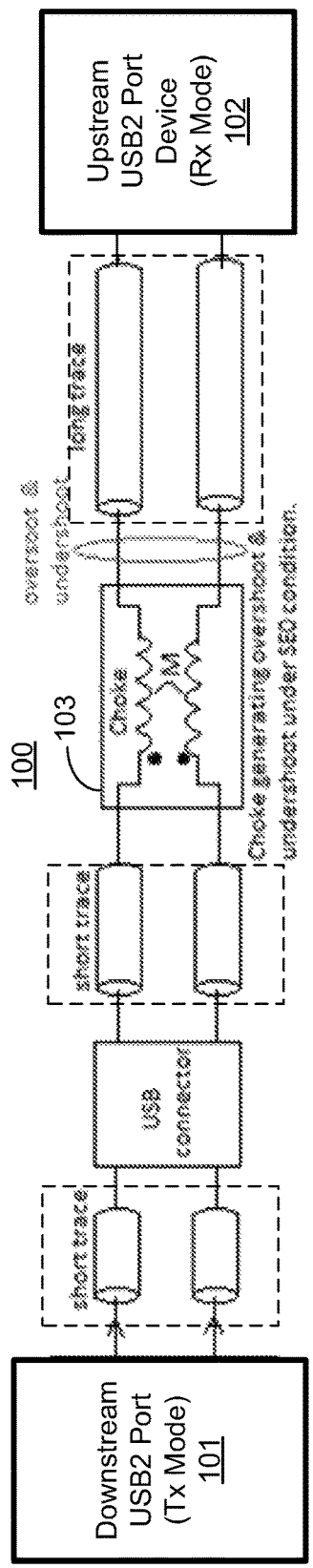
FIG. 1 illustrates an input-output (I/O) system with apparatus to suppress common mode noise to improve EMI (electromagnetic interference), according to one embodiment of the disclosure.

The embodiments provide low power apparatus to clamp overshoots and undershoot to protect devices from electrical overstress (EOS). In one embodiment, the apparatus comprises a sensor to detect entrance of single-ended-zero (SE0) state and to detect exit of the SE0 state. In one embodiment, the sensor is an edge sensor to detect edges of signals on the first and second data lines. In one embodiment, the apparatus further comprises a clamp unit to clamp an overshoot or undershoot condition on the first or second data lines during the detected entrance and exit of the SE0 state. In one embodiment, the sensor comprises a first Schmitt trigger to receive the first data line, where the first Schmitt trigger generates a first output. In one embodiment, the sensor further comprises a second Schmitt trigger to receive the second data line, where the second Schmitt trigger generates a second output. In one embodiment, the apparatus comprises a logic unit to compare the first and second outputs to generate a result output. In this embodiment, the result output is used to generate pulse(s) to control the clamp unit. In one embodiment, the sensor further comprises: a third Schmitt trigger, different from the first and second Schmitt triggers, where the third Schmitt trigger receives the first data line and generates a third output. In this embodiment, the third output is also used to generate pulse(s) to control the clamp unit.

For an I/O driver operating on a power supply (e.g., 3.3V), the apparatus is operable to clamp overshoots to a voltage level near the power supply (e.g., 3.4V). The apparatus is also operable to clamp undershoot to a voltage level near ground (e.g., −46 mV). In one embodiment, the clamps of the apparatus operate at low voltage (e.g., 1V) while the I/O driver operates on a same or higher power supply (e.g., 3.3V). The embodiments use smaller area compared to traditional circuits for reducing overshoots and undershoots. The embodiments use a mostly digital solution that is easy to debug, design, scale over process nodes, and consumes lower power compared to traditional EOS protection circuits. The response time of the clamps of the embodiments is faster than traditional circuits because it utilizes digital solution operating in low voltage and along with a simple active clamp the overshoots and undershoots can be suppressed faster and effectively. The above technical effects are not limiting effects. Other technical effects will be evident with the described embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an input-output (I/O) system 100 with apparatus to clamp overshoot and undershoot, according to one embodiment of the disclosure. In this embodiment, a USB compliant I/O system is discussed. However, the embodiments are not limited to USB complaint I/O systems. For example, the embodiments can apply to other I/O systems e.g., Peripheral Component Interface Express (PCIe) compliant interface, etc. The apparatus discussed here for protecting electrical overstress on devices caused by overshoots and/or undershoots on signals can be used for any I/O or non-I/O system.

In one embodiment, system 100 comprises host 101, short traces, USB connector, choke 103, long trace, and USB device 102. Here, host 101 is in Transmit (Tx) mode and includes the apparatus for clamping overshoot and/or undershoot that occur on interconnects between choke 103 and long traces. Host 101 is also referred here as the USB downstream facing port. USB downstream facing port 101 generates signal during transmit mode and sends signal to upstream facing port device 102 which is in receive mode (Rx).

In one embodiment, upstream facing port or device 102 comprises a sensor to detect entrance of SE0 state on first and second data lines of long traces, and to detect exit of the SE0 state. In one embodiment, the sensor is an edge sensor which detects edges of signals on the first and second data lines. In one embodiment, device 102 further comprises a clamp unit to clamp an overshoot or undershoot condition on the first or second data lines during the detected entrance and exit of the SE0 state. In this exemplary system 100, choke 103 generates overshoot and undershoot under SE0 condition which is described with Reference to FIG. 2. Other components in the system may also contribute to the overshoot and undershoot under SE0 condition. So as not to obscure the embodiments, the overshoot and undershoot suppressing scheme is discussed with reference to SE0 condition. However, the embodiments described here are independent of the cause of overshoot and undershoot, and can be used to suppress overshoot and undershoot generated under any condition.

This embodiment uses an example where downstream facing port 101 is in transmit mode and upstream facing port 102 is in receiving mode. In this condition, overshoot and undershoot generated by choke 103 is suppressed by the clamp circuit inside 102 by detecting SE0 entry and exit conditions. In one embodiment, when downstream facing port 102 is in receiving mode and upstream facing port 102 is in transmitting mode, overshoot and undershoot generated by choke 103 is suppressed by clamp circuit inside 101 by detecting SE0 entry and exit condition.

Figure 2:
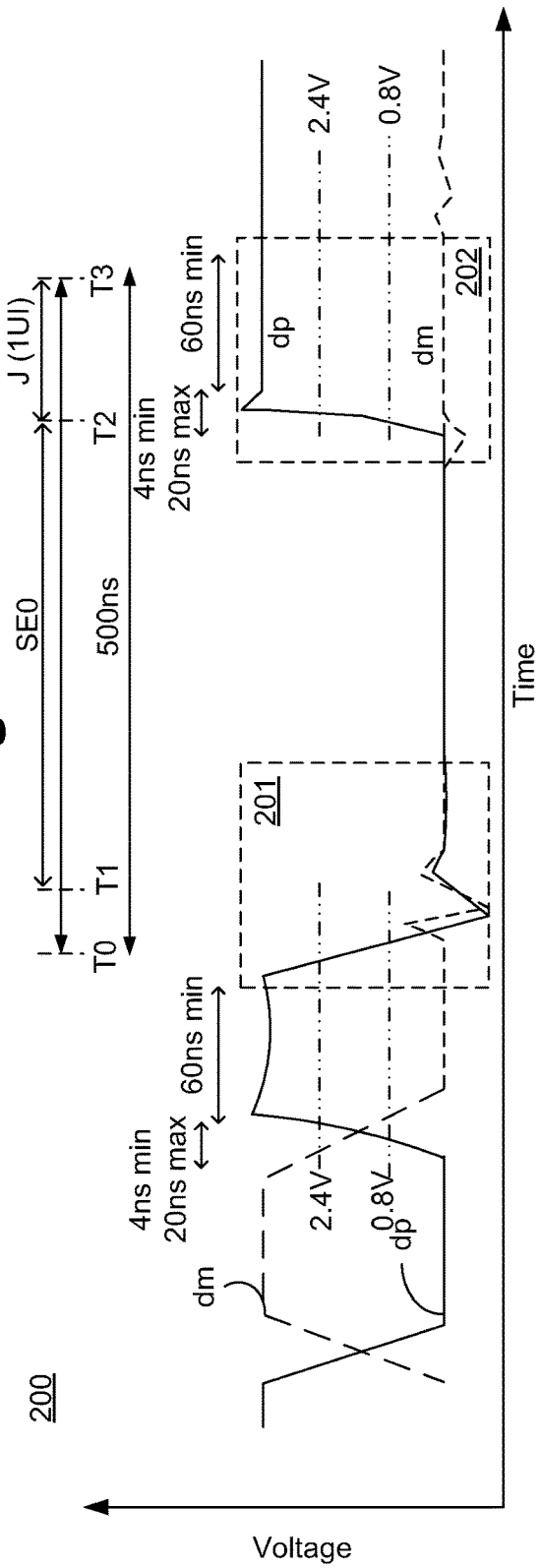
FIG. 2 illustrates a plot with waveforms during End of Packet (EOP) where data line states are two UI (Unit Interval) of single-ended zero (SE0) state followed by 1UI of J-state.

FIG. 2 illustrates a plot 200 with waveforms in SE0 state. It is pointed out that those elements of FIG. 2 having the same reference numbers (or names) as the elements of any other figure can operate or function in any manner similar to that described, but are not limited to such.

Here, x-axis is time and y-axis is voltage. The two signals shown in plot 200 are dp (also referred to as DP) and dm (also referred to as DM) signals which are the data signals of the USB2 interconnect. The solid signal is the dp signal and dashed signal is the dm signal. Both dp and dm signals in this example toggle between 3.3V and 0V. The reference voltage for identifying a logical high is 2.4V and reference voltage for identifying a logical low is 0.8V. In this example, the rise time for the signals is in the range of 4 ns to 20 ns, and the level portion (high and low) of the signals is at least 60 ns.

Windows 201 and 202 highlight the overshoot and undershoot at the entrance and exit SE0 time pointed as T0 and T2 respectively for dp and dm. The time region between T1 and T2 is the SE0 state where both dp and dm are at logical low state for 2UI (unit interval). T3 is the time when dp and dm become stable again (i.e., overshoot and undershoot ends). T2 to T3 time is one UI (i.e., Unit Interval). In one embodiment, a sensor detects the entry point of SE0 at time T0 enable undershoot clamp to clamp undershoot voltage on the interconnects dp and dm. In such an embodiment, undershoot voltage (or simply undershoot) is reduced. In one embodiment, sensor detects the exit point T2 of SE0 state and enables the overshoot clamp to clamp interconnect dp and enables undershoot clamp to clamp interconnect dm in response to the detection of SE0 state exit. In such an embodiment, overshoot is reduced on dp and undershoot is reduced on dm.

Figure 3:
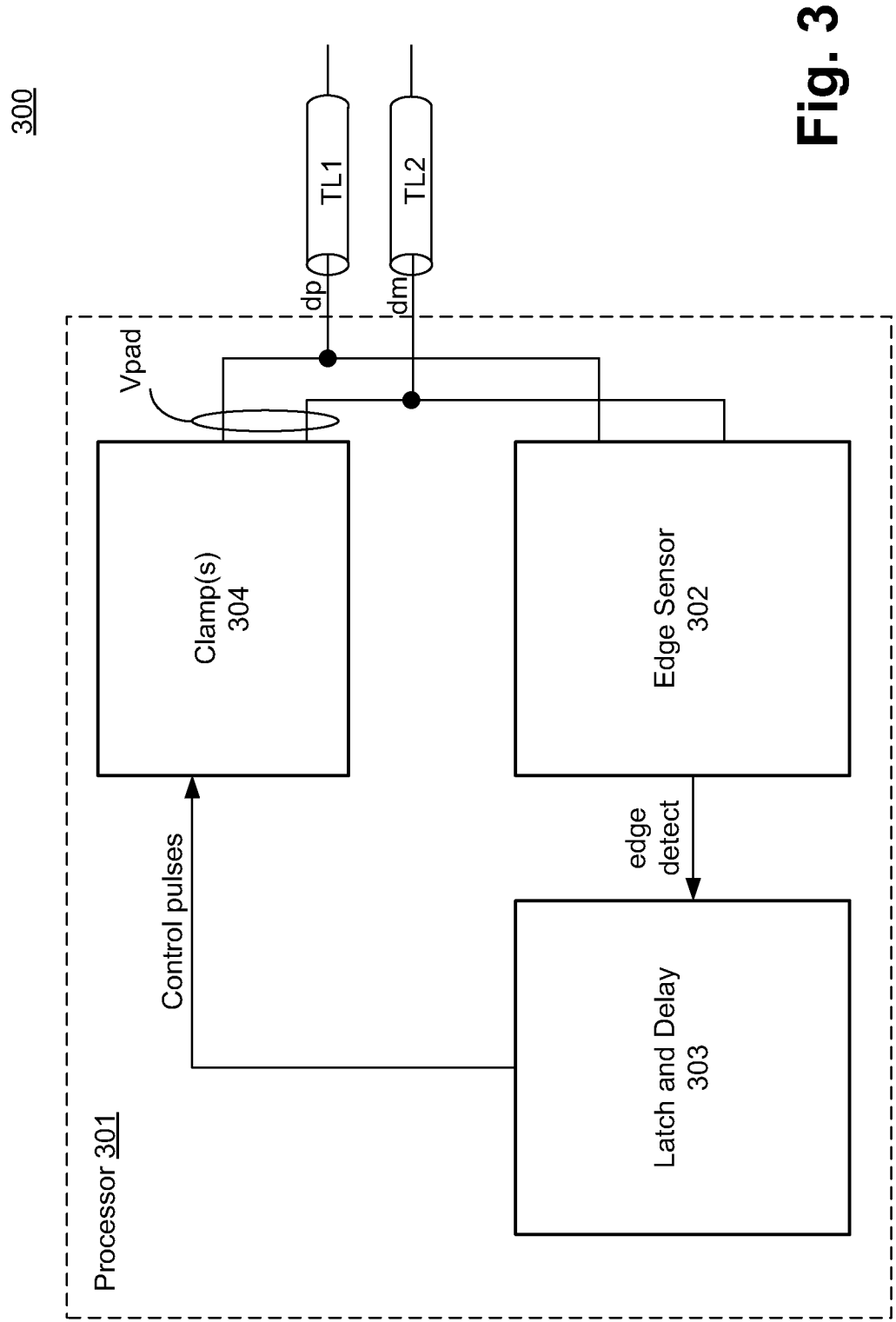
FIG. 3 illustrates a processor with high level apparatus to clamp overshoot and undershoot on data lines, according to one embodiment of the disclosure.

FIG. 3 illustrates a system 300 with a processor with high level apparatus to clamp overshoot and undershoot, according to one embodiment of the disclosure. It is pointed out that those elements of FIG. 3 having the same reference numbers (or names) as the elements of any other figure can operate or function in any manner similar to that described, but are not limited to such.

In one embodiment, system 300 includes processor 301 having apparatus to clamp overshoot and undershoot on signals dp and dm, and having interconnects (or transmission lines (TL)) TL1 and TL2 providing signals dp and dm respectively. In one embodiment, apparatus comprises edge sensor 302, delay and latch unit 303, and clamp(s) 304. In one embodiment, edge sensor 302 monitors dp and dm signals and detects the SE0 state i.e., when dp and/or dm signals transition from high to low such that both dp and dm signals are logical low, and when dp and/or dm signals transition from high to low. While the embodiments are described with reference to detecting SE0 state entrance and exit times and then clamping undershoots and overshoots respectively, the embodiments can be used for clamping any overshoot and/or undershoot condition on signals on one or more interconnects.

In one embodiment edge sensor 302 generates edge detect signals that are received by delay and latch unit 303. In one embodiment, delay and latch unit 303 comprises sequential units to latch the output of edge sensor 302 and to generate signals or pulses to control clamping durations. In one embodiment, clamps(s) 304 receive control signals or pulses to enable the clamps to clamp dp and dm signals by sourcing or sinking current on the interconnects, to reduce undershoot and overshoot on the signals. In one embodiment, clamps 304 are part of an I/O driver and are coupled to pads which then are coupled to interconnect dp and interconnect dm.

Figure 4:
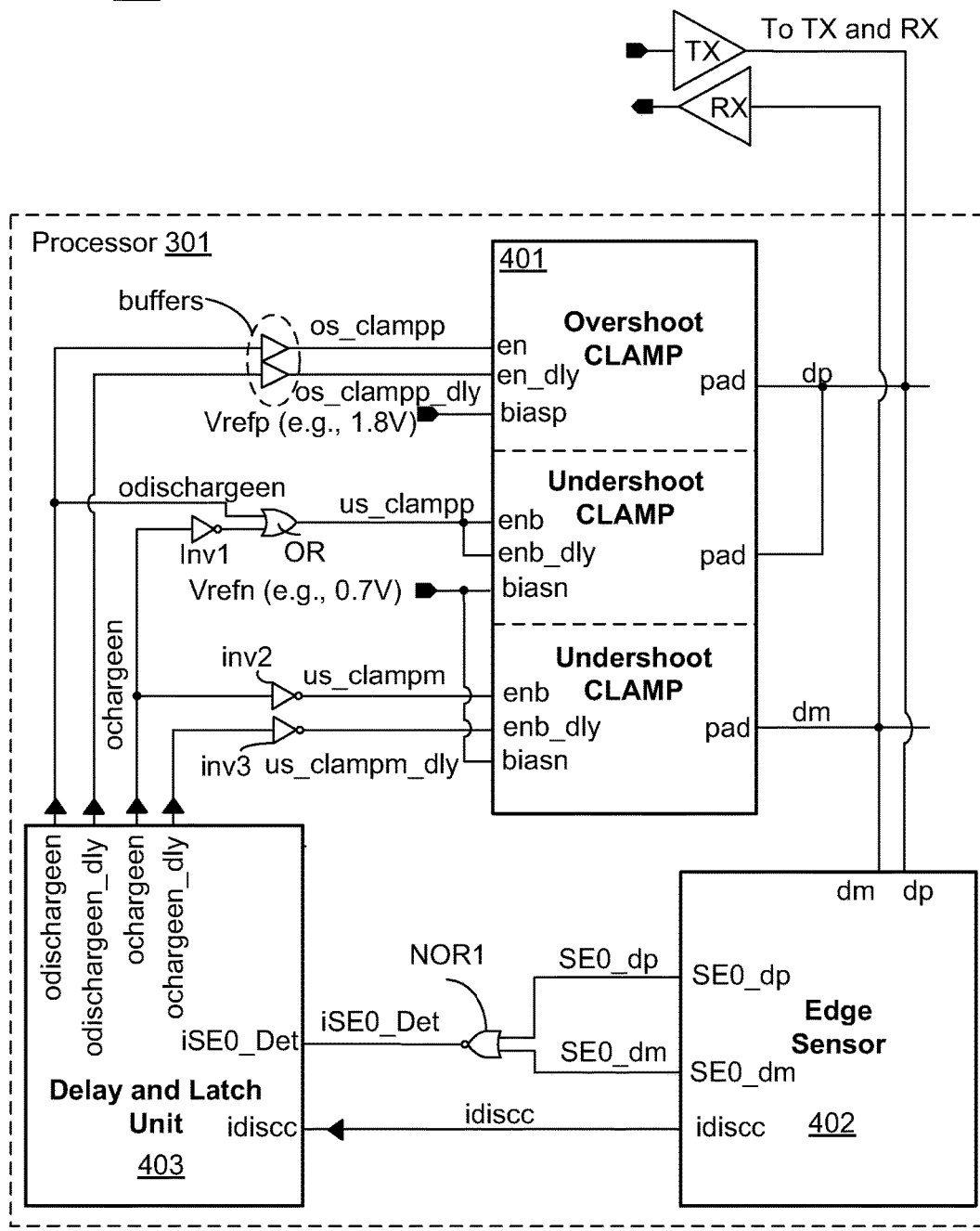
FIG. 4 illustrates a more detailed apparatus to clamp overshoot and undershoot on data lines, according to one embodiment of the disclosure.

FIG. 4 illustrates a more detailed apparatus 400 to clamp overshoot and undershoot, according to one embodiment of the disclosure. It is pointed out that those elements of FIG. 4 having the same reference numbers (or names) as the elements of any other figure can operate or function in any manner similar to that described, but are not limited to such.

In one embodiment, dp and dm signals are received by processor (or apparatus) 301 for appropriate clamping. In one embodiment, this processor or apparatus 301 resides in host 101. In one embodiment, dp and dm are also coupled to transmitter Tx and receiver Rx. In one embodiment, Tx and Rx are part of processor 301.

In one embodiment, clamp 401 (e.g., clamp 304) includes an overshoot clamp and at least two undershoot clamps. As shown in FIG. 2, both dp and dm experience undershoot when entering SE0 state while dp experiences overshoot when exiting SE0 state. In one embodiment, the overshoot clamp clamps the overshoot on dp. In one embodiment, the undershoot clamp clamps undershoot on dp and dm. In one embodiment, an additional overshoot clamp is added to clamp any overshoot on dm. In one embodiment, overshoot clamp receives input signals, en (enable), en_dly (delayed enable), and biasp (a bias voltage Vrefp, e.g., 1.8V). In one embodiment, overshoot clamp sinks current, from the pad (coupled to dp), at the end of the SE0 state. In one embodiment, undershoot clamp receives input signals, enb (inverse of enable), enb_dly (delayed inverse of enable), and biasn (a bias voltage Vrefn, e.g., 0.7V). In one embodiment, undershoot clamp sources current, to the pad (coupled to dp and/or dm), at the beginning of the SE0 state.

In one embodiment, edge sensor 402 (e.g., sensor 302) detects transition edges of dp and dm to generate output signals. In one embodiment, these output signals are generated by sensors (e.g., Schmitt triggers). In one embodiment, the Schmitt triggers operate at low power supply (e.g., 1V) power supply while dp and dm can toggle between a higher power supply and ground (e.g., 3.3V and 0V). In one embodiment, the output signals are SE0_dp (that indicates transition change on dp) and SE0_dm (that indicates transition change on dm).

In one embodiment, an additional sensor (i.e., another Schmitt trigger) detects transition edge on dp and generates idiscc signal. In one such embodiment, the other Schmitt trigger operates at a higher power supply (e.g., 1.8V). In one embodiment, output SE0_dp may be used instead of idiscc. In such an embodiment, the other Schmitt trigger may be removed. Here, SE0_dp is also referred to as the first output signal; SE0_dm is referred to as the second output signal; and idiscc is referred to as the third output signal. In one embodiment, SE0_dp and SE0_dm are logically ORed (e.g., using NOR1 gate) to generate output iSE0_Det (also called result output).

In one embodiment, delay and latch unit 403 (e.g., 303) receives iSE0_Det and idiscc signal and generates a number of signals to control the overshoot and undershoot clamps of clamp unit 401. In one embodiment, delay and latch unit 403 latches the output of edge sensor 402 (e.g., 301) and sequences the overshoot/undershoot protection event. In one embodiment, the outputs of delay and latch unit 403 are odischargeen, odischargeen_dly, ochargeen, and ochargeen_dly. The output signals used here are exemplary signals to explain the operation of various circuits. Other signals (fewer or more) can be used to achieve the outlined functions.

In one embodiment, odischargeen and odischargeen_dly are buffered by buffers to generate os_clampp and os_clampp_dly signals respectively which are coupled to inputs en and en_dly respectively of the overshoot clamp of clamp unit 401. In one embodiment, ochargeen and ochargeen_dly signals are inverted by inverters inv2 and inv3 respectively, which are coupled to inputs enb and enb_dly, respectively, of the undershoot clamp of clamp unit 401. In one embodiment, odischargeen and ochargeend are received by inverter inv1 and OR gate to generate us_clampp which is received by inputs enb and enb_dly of undershoot clamp of clamp unit 401.

Figure 5:
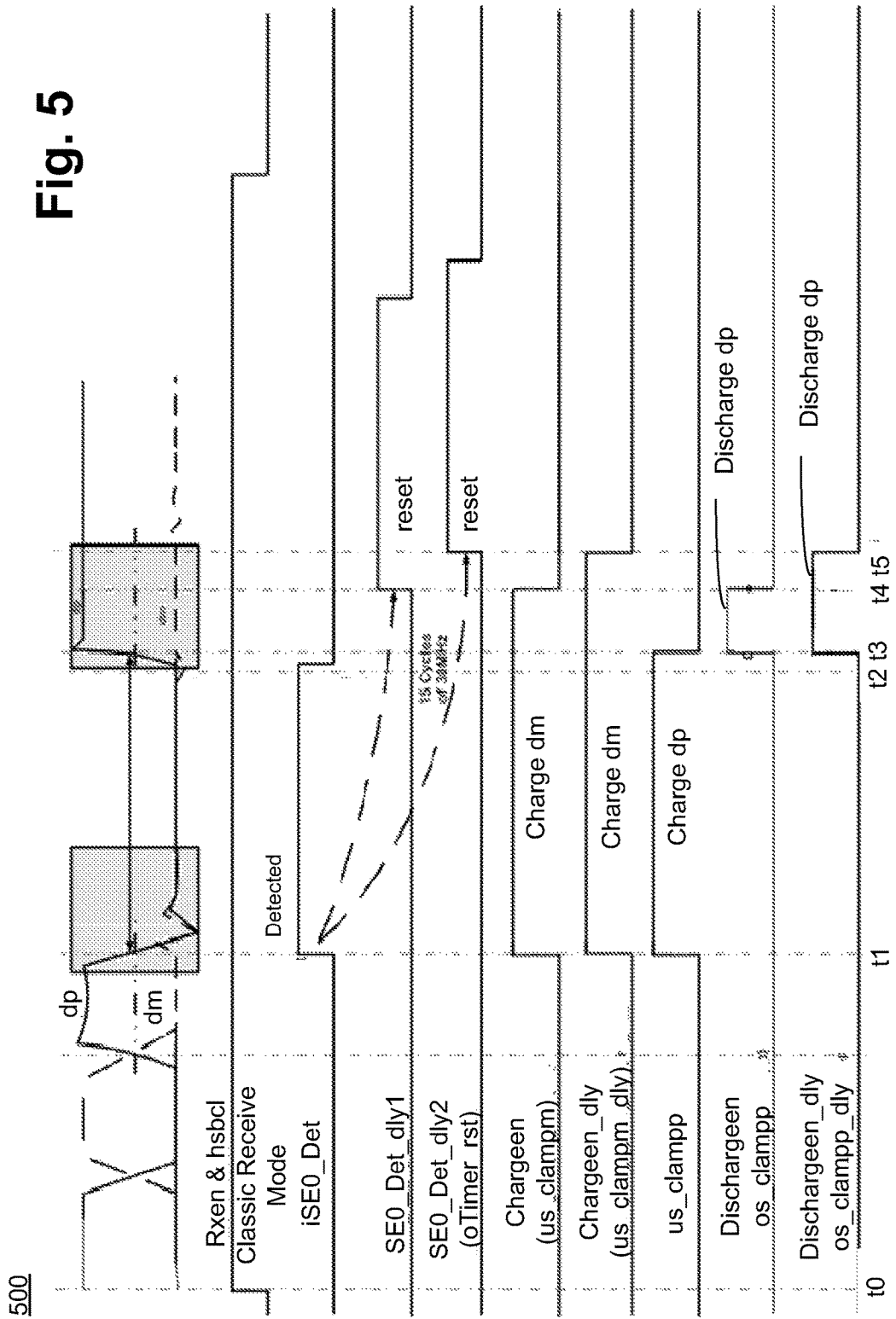
FIG. 5 illustrates a plot with multiple waveforms internally generated by proposed embodiment to control overshoot & undershoot clamps and also showing operation of the apparatus to clamp overshoot and undershoot, according to one embodiment of the disclosure.

FIG. 5 illustrates a plot 500 with multiple waveforms showing operation of the apparatus to clamp overshoot and undershoot, according to one embodiment of the disclosure. It is pointed out that those elements of FIG. 5 having the same reference numbers (or names) as the elements of any other figure can operate or function in any manner similar to that described, but are not limited to such.

The embodiment is described with reference to USB2 operation. However, the embodiments are not limited to USB2 compliant interface, and can be used with any signaling scheme where overshoot and/or undershoot is desired to be suppressed or reduced. For example, the embodiments can apply to Peripheral Component Interface Express (PCIe) complaint receivers/transmitters. Here, x-axis is time and y-axis is voltage. The two waveforms on the top are dp and dm signals which first toggle normally and then they enter and exit SE0 state. These two waveforms are described with reference to FIG. 2.

Referring back to FIG. 5, when the USB2 PHY is operating in classical receive mode (qualified by assertion of Rxen and hsbcl signals at t0), the EOS (electrical overstress) protection circuit (i.e., clamp unit 401, edge sensor 402, delay and latch unit 403, and other combinational logic units of FIG. 4) are armed to protect the Front-End circuitry (i.e., host 101).

In this example, both data lines (DP and DM) see undershoot at the end of every data packet where both lines are pulled low, denoted as SE0 event. The output (i.e., iSE0_det) of edge sensor 402 is triggered high when NOR1 gate detects SE0 condition at t1. An embodiment of edge sensor 402 is described with reference to FIGS. 6-7. Referring back to FIG. 5, in one embodiment, iSE0_det signal is latched by delay and latch unit 403. In one embodiment, delay and latch unit 402 includes sticky flops (or latches) which are triggered to output a '1' (i.e., logical high). An embodiment of delay and latch unit 403 is described with reference to FIG. 8. Referring back to FIG. 5, in one embodiment, the outputs of the sticky flops, ochargeen and ochargeen_dly, activate the undershoot clamp for DP and DM.

In one embodiment, the undershoot clamp's NMOS device which is biased with Vrefn (e.g., 0.7V), supplies current as soon as the DP and DM voltages fall below Vrefn−Vtn. An embodiment of the undershoot clamp of clamp unit 401 is described with reference to FIG. 9B. Referring back to FIG. 5, in one embodiment, ochargeen and ochargeen_dly signals continue to stay high after the SE0 transition, pre-charging the line to prepare for upcoming SE0-exit event where DM line sees an undershoot, while DP line sees an overshoot at t2.

During SE0-exit, the edge sensor circuit's output idiscc is triggered high when the DP line voltage is above a threshold (e.g., 1.3V) at t3. This signal is latched and triggers the sticky flops (i2 and i3) to output a '1.' The outputs of the sticky flops, odischargeen and odischargeen_dly go on to activate the overshoot clamp for DP. An embodiment of the overshoot clamp of clamp unit 401 is described with reference to FIG. 9A. The overshoot clamp's diode-connected and Vrefp (e.g., 1.8V) biased PMOS drains current as soon as the DP and DM pins exceeds Vrefp+2Vtn+2Vdsat.

Referring back to FIG. 5, in this example, the mutual coupling of interconnects in choke 103 causes DM line to go to opposite direction when DP goes high. Since signals ochargeen and ochargeen_dly remain high, the DM's undershoot clamp stays active to overcome the undershoot. The detection of SE0 event (i.e., iSE0_det='1') also triggers the delay and latch unit 403 to delay the SE0 detection for a number of clock cycles (e.g., 14 and 15 cycles of 30 MHz clock) and assert the signal SE0_det_dly1 and SE0_det_dly2 respectively, as shown at t4 and t5. These signals are used to shut off the protection circuit (i.e., clamp unit 401, sensor 402, delay and latch unit 403) in a stagger manner to avoid kick back due to inductive nature of choke 103. In one embodiment, the delay signals also reset the protection circuit back to default state to prepare for next SE0 event.

FIGS. 6A-B illustrates edge sensors 600 and 620 to sense SE0 entrance detection, according to one embodiment of the disclosure. It is pointed out that those elements of FIGS. 6A-B having the same reference numbers (or names) as the elements of any other figure can operate or function in any manner similar to that described, but are not limited to such.

In one embodiment, edge sensor 600 comprises a first Schmitt trigger 601 and a second Schmitt trigger 602. In this embodiment, first Schmitt trigger 601 receives input DP and generates output SE0_dp. In this embodiment, second Schmitt trigger 602 receives input DM and generates output SE0_dm. Continuing with the USB2 example, the entrance of SE0 occurs when DP and/or DM transition from logical high (e.g., 3.3V) to logical low (e.g., 0V). In this embodiment, first and second Schmitt triggers 601 and 602 respectively operate at low voltage (e.g., 1V) because they are being used to detect SE0 entrance. A circuit implementation of first Schmitt trigger 601 (or second Schmitt trigger 602) is shown in the circuit embodiment 620.

In one embodiment, Schmitt trigger 620 comprises n-type devices MNs1, MNs2, MNs3, MNNs, p-type devices MPs1, MPs2, and MPs3. In this embodiment, the input to Schmitt trigger 620 is IN and output is Out. In one embodiment, MPs1, MPs2, MNs2 and MNs1 are coupled in series, where source terminal of MPs1 is coupled to power supply (e.g., 1V) while source terminal of MNs1 is coupled to ground.

In one embodiment, source terminal of MNs3 is coupled to drain terminal of MNs1 and source terminal of MNs2, drain terminal of MNs3 is coupled to power supply (e.g., 1V), and gate terminal is coupled to Out. In one embodiment, source terminal of MPs3 is coupled to source terminal of MPs2 and drain terminal of MPs1, drain terminal of MPs3 is coupled to ground, and gate terminal of MPs3 is coupled to Out. In one embodiment, MNNs is a thick gate device while other devices of circuit 620 are thin gate (or of normal gate thickness) devices. In one embodiment, gate terminal of MNNs is coupled to high power supply (e.g., 1.8V) and source/drain terminal is coupled to IN and drain/source terminal is coupled to gate inputs of MNs1, MNs2, MPs2, and MPs1.

In one embodiment, Schmitt trigger 620 has low-to-high switching threshold of near mid supply (e.g., 0.6V) and high-to-low switching threshold below the low-to-high switching threshold (e.g., 0.4V). In one embodiment, during SE0 state (when both data lines DP and DM experience undershoot conditions), Schmitt trigger 620 trips when data lines go below 0.4V. At that point Schmitt trigger 620 identifies entrance to SE0 state.

Figure 7B:
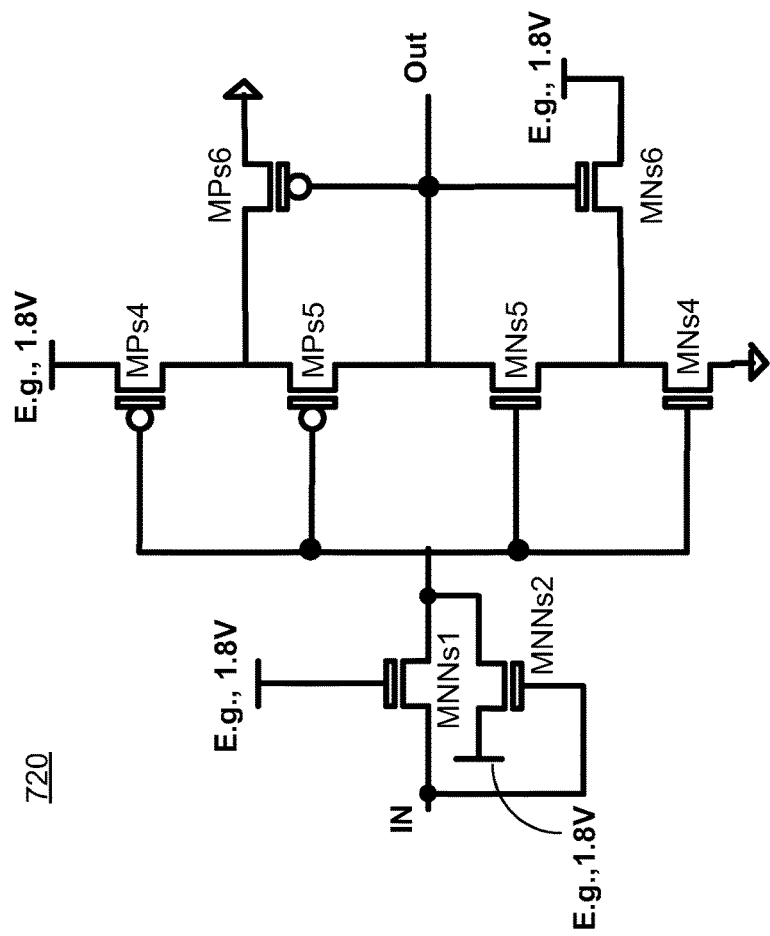
FIGS. 7A-B illustrates edge sensors to sense SE0 exit detection, according to one embodiment of the disclosure.
Figure 7A:
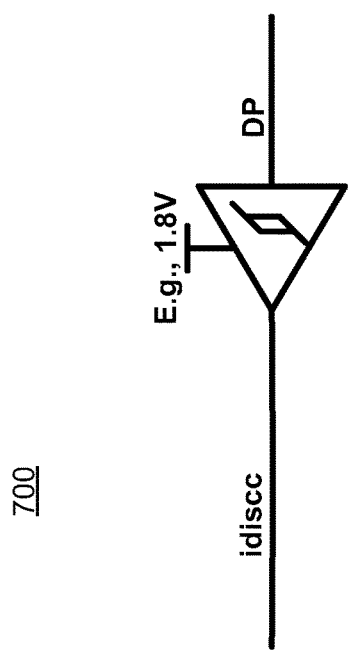

FIGS. 7A-B illustrates edge sensors 700 and 720 to sense SE0 exit detection, according to one embodiment of the disclosure. It is pointed out that those elements of FIGS. 7A-B having the same reference numbers (or names) as the elements of any other figure can operate or function in any manner similar to that described, but are not limited to such.

In one embodiment, edge sensor 700 comprises a Schmitt trigger (also called third Schmitt trigger) that is coupled to DP and outputs idiscc. In one embodiment, Schmitt trigger operates at a higher supply voltage (e.g., 1.8V) than the first and second Schmitt triggers 601 and 602, respectively, because third Schmitt trigger is used to detect exit of SE0 state. SE0 state exits when DP transitions from low (e.g., 0V) to high (e.g., 3.3V). A circuit implementation of Schmitt trigger in edge sensor 700 is shown in the circuit embodiment 720.

In one embodiment, Schmitt trigger 720 comprises n-type devices MNs4, MNs5, MNs6, MNNs1, and MNNs2, and p-type devices MPs4, MPs5, and MPs6. In one embodiment, n-type devices MNs4, MNs5, MNs6, MNNs1, and MNNs2 are thick gate devices. In one embodiment, MNs4, MNs5, MPs5, and MPs4 are coupled together in series, where drain terminal of MPs4 is coupled to power supply (e.g., 1.8V) and source terminal of MNs4 is coupled to ground (e.g., 0V).

In one embodiment, source terminal of MNs6 is coupled to drain terminal of MNs4 and source terminal of MNs5, drain terminal of MNs6 is coupled to power supply (e.g., 1.8V), and gate terminal is coupled to Out. In one embodiment, source terminal of MPs6 is coupled to source terminal of MPs5 and drain terminal of MPs4, drain terminal of MPs6 is coupled to ground, and gate terminal of MPs6 is coupled to Out. In one embodiment, gate terminal of MNNs1 is coupled to high power supply (e.g., 1.8V) and source/drain terminal is coupled to IN and drain/source terminal is coupled to gate inputs of MNs4, MNs5, MPs5, and MPs4. In one embodiment, source terminal of MNNs2 is coupled to gate inputs of MNs4, MNs5, MPs5, and MPs4, gate terminal of MNNs2 is coupled to IN and drain terminal of MNNs2 is coupled to power supply (e.g., 1.8V).

In one embodiment, Schmitt trigger 720 has a low-to-high switching threshold (e.g., 1.3V) and high-to-low switching threshold (e.g., 1.1V) to detect a rising DP. In one embodiment, Schmitt trigger 720 outputs a '1' on idiscc when the pad voltage exceeds the low-to-high switching threshold (e.g., 1.3V).

Figure 8:
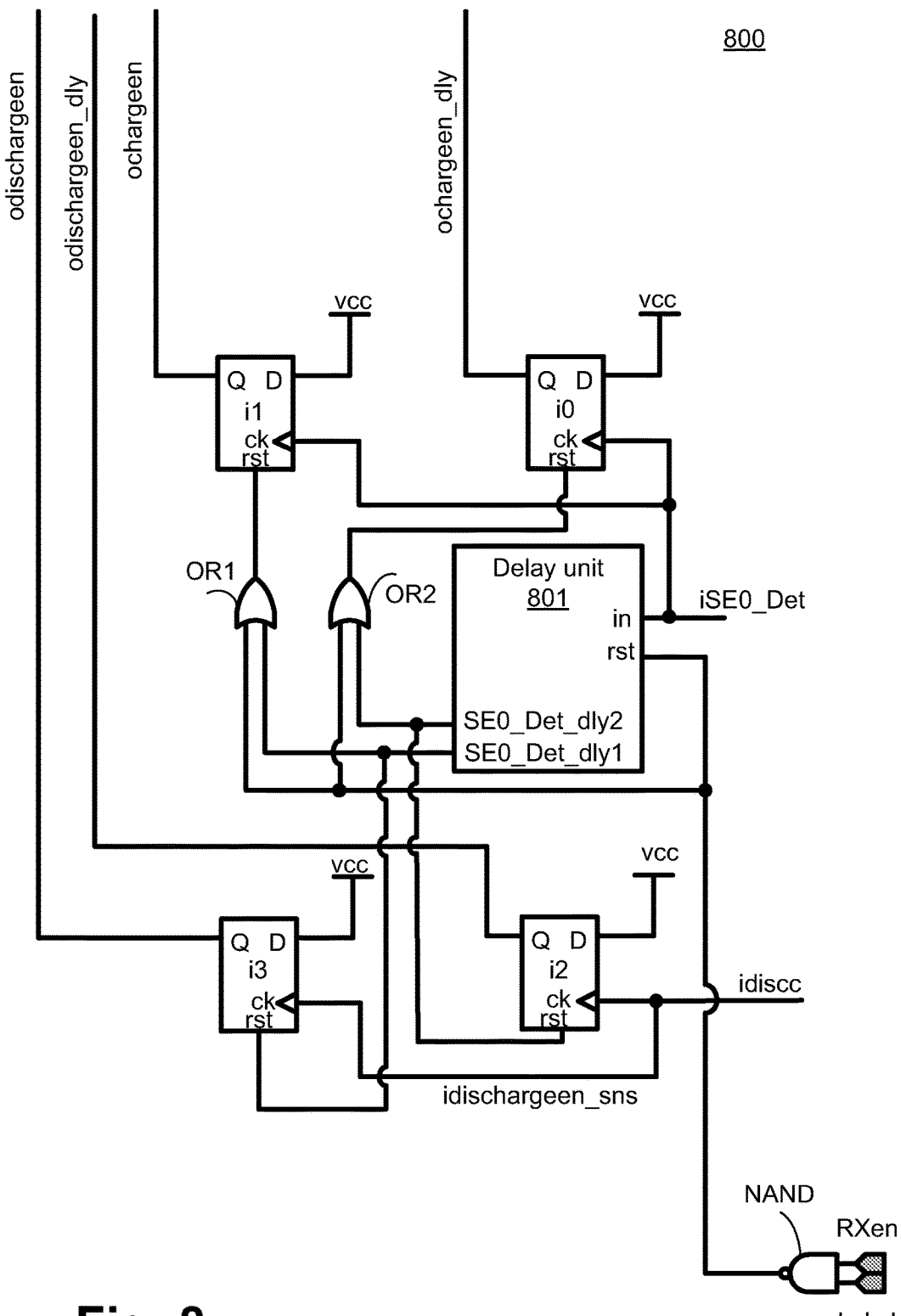
FIG. 8 illustrates a delay and latch unit to generate signals to enable and disable clamp to suppress overshoot and undershoot on data line, according to one embodiment of the disclosure.

FIG. 8 illustrates a latch and delay unit 800 (e.g., 303, 403) to generate signals to clamp overshoot and undershoot, according to one embodiment of the disclosure. It is pointed out that those elements of FIG. 8 having the same reference numbers (or names) as the elements of any other figure can operate or function in any manner similar to that described, but are not limited to such.

In one embodiment, latch and delay unit 800 comprises sequential units i0, i1, i2, and i3; delay unit 801, and combinations logic gates (e.g., NAND, OR logic gates, etc.). In one embodiment, delay unit 801 comprises one or more delay cells that receive input "in" (i.e., iSE0_Det) and generates SE0_Det_dly1 and SE0_Det_dly2 outputs. In one embodiment, SE0_Det_dly1 and SE0_Det_dly2 are used as reset (rst) signals for sequential units i2 and i3. In one embodiment, SE0_Det_dly1 and SE0_Det_dly2 are individually ORed by OR gates OR1 and OR2 along with output of NAND gate to generate reset (rst) signal for sequential units i0 and i1.

In one embodiment, iSE0_Det is received as clock signal for sequential units i0 and i1. In one embodiment, data inputs for sequential units i0, i1, i2, and i3 are tied to power supply (e.g., Vcc). In one embodiment, output of sequential unit i0 is ochargeen_dly. In one embodiment, output of sequential unit i1 is ochargeen. In one embodiment, output of sequential unit i2 is odischargeen_dly. In one embodiment, output of sequential unit i3 is odischargeen. In one embodiment, when RXen and hsbcl are both high, latch and delay unit 800 is enabled. In one embodiment, RXen and hsbcl are received by NAND gate which generates an output reset (rst) signal for delay unit 801 and sequential units i0 and i1.

In one embodiment, sticky sequential units i0, i1, i2, and i3 serve as latches to hold the states of the edge sensor 403. Here, the term "sticky" refers to sequential units with constant outputs that can change by reset, set, or clear signal inputs. In one embodiment, the delay unit 801 generates the delay version of SE0 detection and used to shut off the clamp and reset the protection circuit to a default state.

Figure 9A:
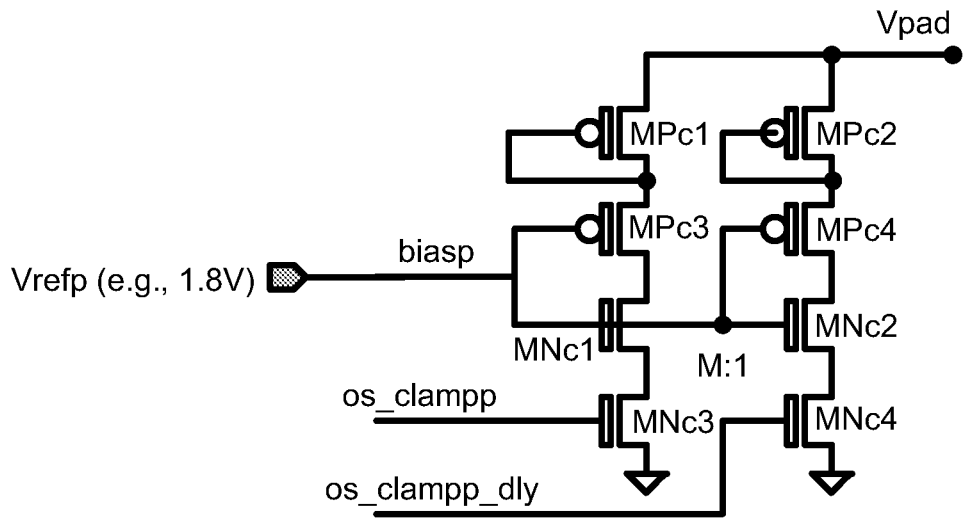
FIG. 9A-B illustrates circuits for overshoot and undershoot clamps respectively, according to one embodiment of the disclosure.
Figure 9B:
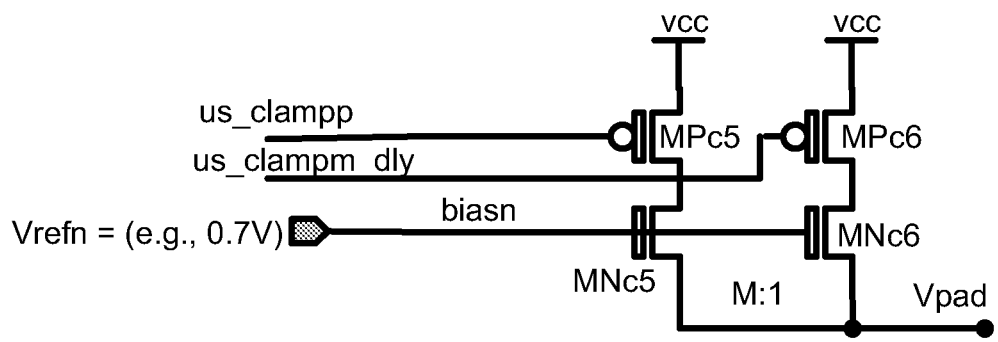

FIG. 9A-B illustrate overshoot and undershoot clamps 900 and 920 respectively, according to one embodiment of the disclosure. It is pointed out that those elements of FIGS. 9A-B having the same reference numbers (or names) as the elements of any other figure can operate or function in any manner similar to that described, but are not limited to such.

In one embodiment, overshoot clamp 900 comprises p-type devices MPc1, MPc2, MPc3, and MPc4; and n-type devices MNc1, MNc2, MNc3, and MNc4. In one embodiment, source terminals of MPc1 and MPc2 are coupled to Vpad (i.e., DP or DM). In one embodiment, gate terminal of MPc1 is coupled to drain terminal of MPc1. In one embodiment, gate terminal of MPc2 is coupled to drain terminal of MPc2. In one embodiment, gate terminals of MPc3, MPc4, MNc1, and MNc2 are coupled to bias terminal biasp having voltage Vrefp (e.g., 1.8V). In one embodiment, MNc3, MNc1, MPc3, and MPc1 are coupled in series, where source terminal of MNc3 is coupled to ground. In one embodiment, gate terminal of MNc3 is coupled to os_clampp. In one embodiment, gate terminal of MNc4 is coupled to os_clampp_dly. In one embodiment, MNc4, MNc2, MPc4, and MPc2 are coupled in series, where source terminal of MNc4 is coupled to ground.

In one embodiment, both overshoot clamp 900 and undershoot clamp 920 are designed with two legs with different sizing (W/L) weight-age. For example, the ratio of the device leg sizing is 'M,' where 'M' is an integer. In one embodiment, both legs are enabled at the same time. In one embodiment, during shut-off, the stronger leg with 'M' sizing is shut off one clock cycle (e.g., 30 MHz) prior to the weaker one. In one embodiment, this staggering is used to minimize the kick back effect due to the inductive nature of choke 103.

In one embodiment, overshoot clamp 900 drains current from the line (Vpad i.e., DP or DM) when the line's voltage is more than Vrefp+2Vdsat+2Vtp. In this example, Vrefp is 1.8V, nominal Vdsat is about 0.1V and nominal Vtp is about 0.5V and so the clamp starts to conduct at about 3V.

In one embodiment, undershoot clamp 920 comprises p-type transistors MPc5, MPc6; n-type transistors MNc5 and MNc6. In one embodiment, MNc5 and MPc5 are coupled in series, where source terminal of MPc5 is coupled to power supply (i.e., Vcc). In one embodiment, MNc6 and MPc6 are coupled in series, where source terminal of MPc6 is coupled to power supply (i.e., Vcc). In one embodiment, source terminals of MNc5 and MNc6 are coupled to Vpad (i.e., DP or DM). In one embodiment, gate terminal of MPc5 is coupled to us_clampp. In one embodiment, gate terminal of MPc6 is coupled to us_clampm_dly. In one embodiment, gate terminals of MNc5 and MNc6 are coupled to bias terminal biasn which received vbias voltage Vrefn (e.g., 0.7V).

In one embodiment, undershoot clamp 920 supplies current to the line Vpad (i.e., DP or DM) when the line's voltage is less than Vrefn−Vtn. In this example, Vrefn is 0.7V and the nominal Vtn is about 0.5V for thick gate and so the clamp starts to conduct at about 0.2V.

Figure 10:
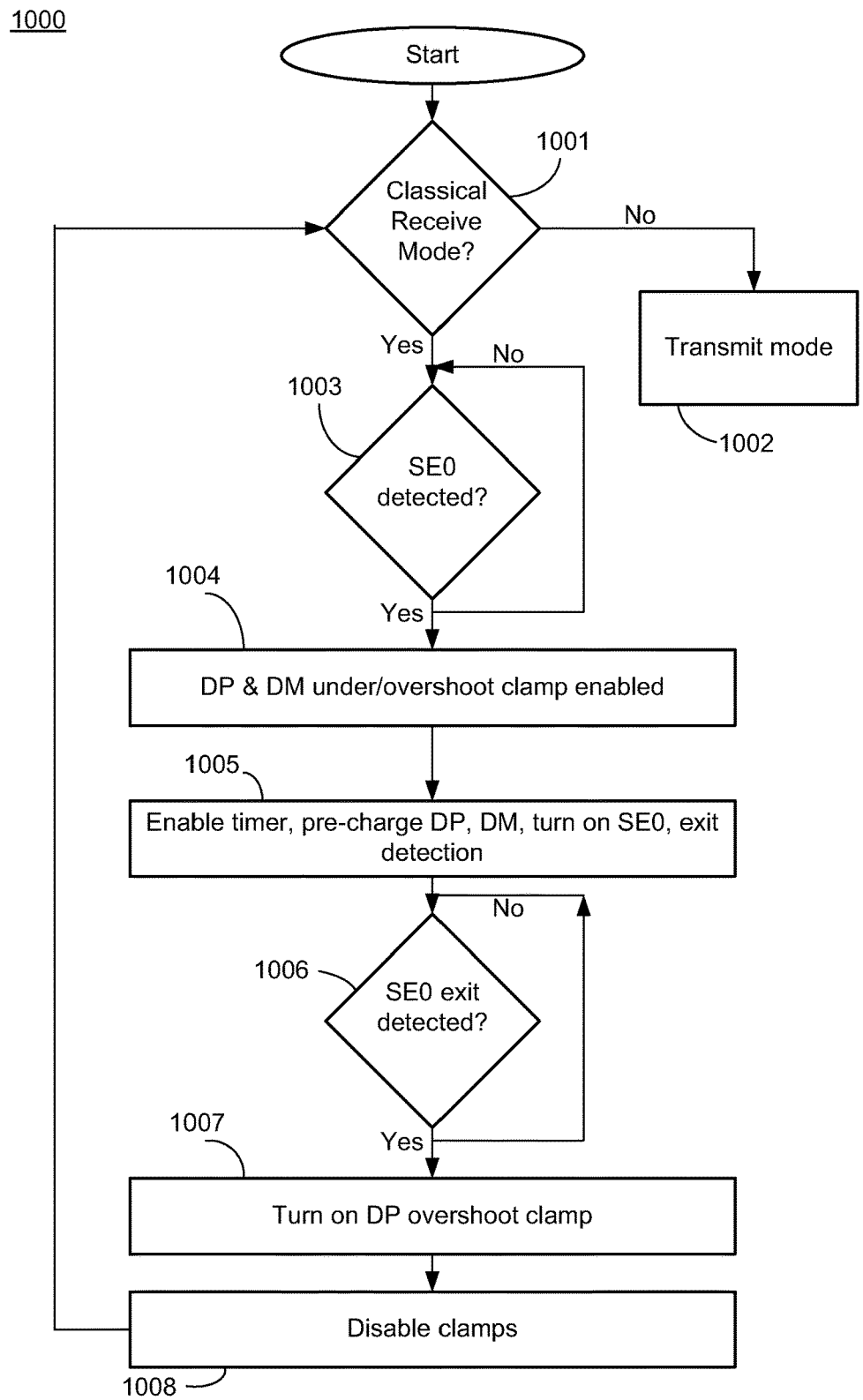
FIG. 10 illustrates a flowchart for enabling and disabling overshoot and undershoot clamp circuits, according to one embodiment of the disclosure.

FIG. 10 illustrates a flowchart 1000 for clamping overshoot and undershoots, according to one embodiment of the disclosure. It is pointed out that those elements of FIG. 10 having the same reference numbers (or names) as the elements of any other figure can operate or function in any manner similar to that described, but are not limited to such.

Although the blocks in the flowcharts with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1001, determination is made whether the receiver Rx (of host 101) is in classical receive mode. If receiver Rx is in classical receive mode, then the process proceeds to block 1003 else it proceeds to block 1002. At block 1002, the I/O (of host 101) is in transmit mode and the protection circuit is disabled (i.e., clamp 401, edge sensor 402, latch and delay unit 403, etc., are disabled). At block 1003, a determination is made whether SE0 state is detected by edge sensor 402. If no SE0 state is detected, then the process loops back to block 1003, else the process proceeds to block 1004.

At block 1004, clamp unit 401 is enabled i.e., DP and DM undershoot clamps and overshoot clamp are enabled. The process then proceeds to block 1005. At block 1005, a timer circuit is enabled and edge sensor 402 begins to detect the exit of SE0 state. At block 1006 a determination is made whether end of SE0 state is detected. If end of SE0 state is not detected, the process loops back to block 1006, else the process proceeds to block 1007. At block 1007, overshoot clamp of clamp unit 401 is enabled. At block 1008, the clamps are disabled because the overshoot and undershoots have been taken care off, and the process proceeds to block 1001.

Figure 11:
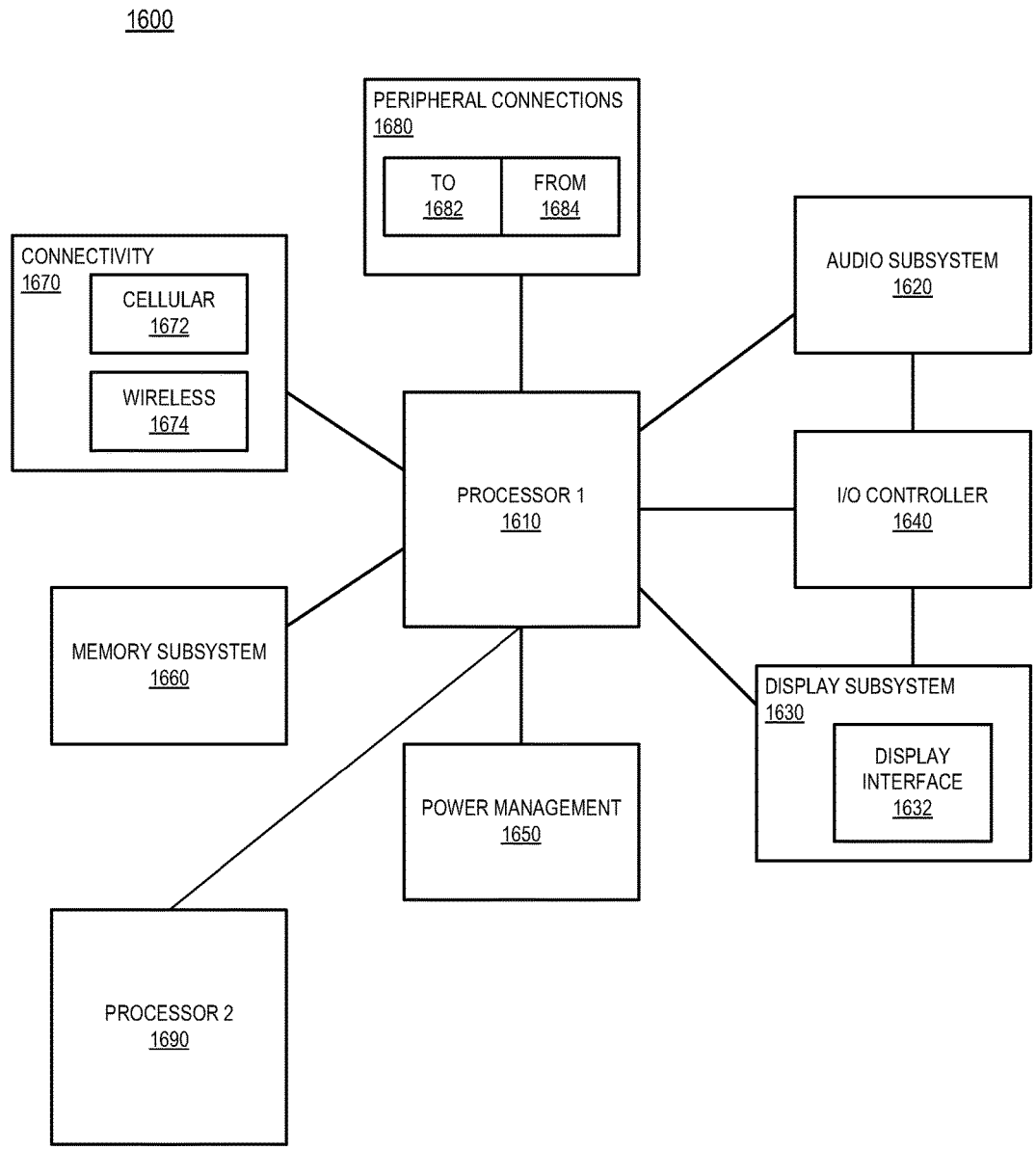
FIG. 11 is a smart device or a computer system or a SoC (system-on-chip) with apparatus to clamp overshoot and undershoot, according to one embodiment of the disclosure.

FIG. 11 is a smart device or a computer system or an SoC (system-on-chip) with apparatus to clamp overshoot and undershoot, according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with apparatus to clamp overshoot and undershoot described with reference to embodiments discussed. Other blocks of the computing device 1600 may also include apparatus to clamp overshoot and undershoot described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a sensor to detect entry of single-ended-zero (SE0) state on first and second data lines, and to detect exit of the SE0 state; and a clamp unit to clamp an overshoot or undershoot voltage on the first or second data lines during the detected entrance and exit of the SE0 state. In one embodiment, the sensor comprises: a first Schmitt trigger to receive the first data line, the first Schmitt trigger to generate a first output; a second Schmitt trigger to receive the second data line, the second Schmitt trigger to generate a second output; and a logic to compare the first and second outputs to generate a resulting output.

In one embodiment, the sensor further comprises: a third Schmitt trigger, different from the first and second Schmitt triggers, the third Schmitt trigger to receive the first data line and to generate a third output. In one embodiment, the apparatus further comprises a first logic to generate a first pulse signal according to the resulting output. In one embodiment, the apparatus further comprises a second logic to generate a second pulse signal according to the third output. In one embodiment, the clamp unit comprises an overshoot clamp to sink current from the first data line according to the first pulse signal. In one embodiment, the clamp unit comprises a first undershoot clamp to supply current to the first data line according to the first pulse signal. In one embodiment, the clamp unit comprises a second undershoot clamp to supply current to the second data line according to the second pulse signal.

In another example, a method is provided which comprises: determining whether a signaling entrance state is detected on first or second data lines; and enabling an undershoot clamp when the signaling entrance state is detected on the first and second data lines, the undershoot clamp to reduce undershoot on the first or second data lines. In one embodiment, the method further comprises: determining whether an signaling exit state is detected on the first or second data lines; and enabling an overshoot clamp when the signaling exit state is detected on the first or second data lines. In one embodiment, the method further comprises disabling the undershoot and overshoot clamps after a predetermined time. In one embodiment, the disabling of the undershoot clamp occurs at a different time than the disabling of the overshoot clamp.

In another example, a system is provided which comprises: a memory unit; a processor, coupled to the memory unit, the processor having a Universal Serial Bus (USB) interface having first and second data lines, the processor comprising: a sensor to detect entrance of signaling state on the first and second data lines, and to detect exit of the signaling state; and a clamp unit to clamp an overshoot or undershoot condition on the first and second data lines during the detected entrance and exit of the signaling state; and a wireless interface for allowing the processor to communicate with another device. In one embodiment, the sensor comprises: a first Schmitt trigger to receive the first data line, the first Schmitt trigger to generate a first output; a second Schmitt trigger to receive the second data line, the second Schmitt trigger to generate a second output; and a logic to compare the first and second outputs to generate a result output.

In one embodiment, the sensor further comprises: a third Schmitt trigger, different from the first and second Schmitt triggers, the third Schmitt trigger to receive the first data line and to generate a third output. In one embodiment, the processor further comprises a first logic to generate a first pulse signal according to the result output. In one embodiment, the processor further comprises a second logic to generate second pulse signal according to the third output. In one embodiment, the clamp unit comprises an overshoot clamp to sink current from the first data line according to the first pulse signal. In one embodiment, the clamp unit comprises: a first undershoot clamp to supply current to the first data line according to the first pulse signal and a second undershoot clamp to supply current to the second data line according to the second pulse signal. In one embodiment, the system further comprises a display unit. In one embodiment, the display unit is a touch screen.

In another example, an apparatus is provided which comprises: a sensor to detect entry of a signaling state on first and second data lines, and to detect exit of the signaling state; and a clamp unit to clamp an overshoot or undershoot voltage on the first or second data lines during the detected entrance and exit of the signaling state. In one embodiment, the sensor comprises: a first Schmitt trigger to receive the first data line, the first Schmitt trigger to generate a first output; a second Schmitt trigger to receive the second data line, the second Schmitt trigger to generate a second output; and a logic to compare the first and second outputs to generate a resulting output.

In one embodiment, the sensor further comprises: a third Schmitt trigger, different from the first and second Schmitt triggers, the third Schmitt trigger to receive the first data line and to generate a third output. In one embodiment, the apparatus further comprises a first logic to generate a first pulse signal according to the resulting output. In one embodiment, the apparatus further comprises a second logic to generate a second pulse signal according to the third output.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a sensor to detect entry of single-ended-zero (SE0) state on first and second data lines, and to detect exit of the SE() state, wherein the sensor comprises
   a first Schmitt trigger to receive the first data line, the first Schmitt trigger to generate a first output,
   a second Schmitt trigger to receive the second data line, the second Schmitt trigger to generate a second output, and
   a logic to compare the first and second outputs to generate a resulting output; and
      a clamp unit to clamp an overshoot or undershoot voltage on the first or second data lines during the detected entrance and exit of the SE0 state.

2. The apparatus of claim 1, wherein the sensor further comprises:
   a third Schmitt trigger, different from the first and second Schmitt triggers, the third Schmitt trigger to receive the first data line and to generate a third output.

3. The apparatus of claim 2 further comprises a first logic to generate a first pulse signal according to the resulting output.

4. The apparatus of claim 3, wherein the clamp unit comprises an overshoot clamp to sink current from the first data line according to the first pulse signal.

5. The apparatus of claim 2 further comprises a second logic to generate a second pulse signal according to the third output.

6. The apparatus of claim 5, wherein the clamp unit comprises a first undershoot clamp to supply current to the first data line according to the first pulse signal.

7. The apparatus of claim 5, wherein the clamp unit comprises a second undershoot clamp to supply current to the second data line according to the second pulse signal.

8. A method comprising:
   determining, using a sensor, whether a signaling entrance state is detected on first or second data lines, wherein the sensor comprises a first Schmitt trigger to receive the first data line, the first Schmitt trigger to generate a first output, a second Schmitt trigger to receive the second data line, the second Schmitt trigger to generate a second output, and a logic to compare the first and second outputs to generate a resulting output; and
   enabling an undershoot clamp when the signaling entrance state is detected on the first and second data lines, the undershoot clamp to reduce undershoot on the first or second data lines.

9. The method of claim 8 further comprises:
   determining whether an signaling exit state is detected on the first or second data lines; and
   enabling an overshoot clamp when the signaling exit state is detected on the first or second data lines.

10. The method of claim 9 further comprises disabling the undershoot and overshoot clamps after a predetermined time.

11. The method of claim 10, wherein the disabling of the undershoot clamp occurs at a different time than the disabling of the overshoot clamp.

12. A system comprising:
a memory unit;
a processor, coupled to the memory unit, the processor having a Universal Serial Bus (USB) interface having first and second data lines, the processor comprising:
a sensor to detect entrance of signaling state on the first and second data lines, and to detect exit of the signaling state, wherein the sensor comprises
a first Schmitt trigger to receive the first data line, the first Schmitt trigger to generate a first output,
a second Schmitt trigger to receive the second data line, the second Schmitt trigger to generate a second output, and
a logic to compare the first and second outputs to generate a result output; and
a clamp unit to clamp an overshoot or undershoot condition on the first and second data lines during the detected entrance and exit of the signaling state;
and
a wireless interface for allowing the processor to communicate with another device.

13. The system of claim 12, wherein the sensor further comprises:
a third Schmitt trigger, different from the first and second Schmitt triggers, the third Schmitt trigger to receive the first data line and to generate a third output.

14. The system of claim 13 further comprises a first logic to generate a first pulse signal according to the result output.

15. The system of claim 14 further comprises a second logic to generate second pulse signal according to the third output.

16. The system of claim 15, wherein the clamp unit comprises an overshoot clamp to sink current from the first data line according to the first pulse signal.

17. The system of claim 16, wherein the clamp unit comprises:
a first undershoot clamp to supply current to the first data line according to the first pulse signal and
a second undershoot clamp to supply current to the second data line according to the second pulse signal.

18. The system of claim 12 further comprises a display unit.

19. An apparatus comprising:
a sensor to detect entry of a signaling state on first and second data lines, and to detect exit of the signaling state, wherein the sensor comprises
a first Schmitt trigger to receive the first data line, the first Schmitt trigger to generate a first output,
a second Schmitt trigger to receive the second data line, the second Schmitt trigger to generate a second output, and
a logic to compare the first and second outputs to generate a resulting output; and
a clamp unit to clamp an overshoot or undershoot voltage on the first or second data lines during the detected entrance and exit of the signaling state.

20. The apparatus of claim 19, wherein the sensor further comprises:
a third Schmitt trigger, different from the first and second Schmitt triggers, the third Schmitt trigger to receive the first data line and to generate a third output.

21. The apparatus of claim 20 further comprises a first logic to generate a first pulse signal according to the resulting output.

22. The apparatus of claim 20 further comprises a second logic to generate a second pulse signal according to the third output.

* * * * *